(12) United States Patent
Simmons (10) Patent No.: US 8,552,994 B2
(45) Date of Patent: Oct. 8, 2013

(54) METHOD AND APPARATUS TO MEASURE SELF-CAPACITANCE USING A SINGLE PIN

(75) Inventor: Martin John Simmons, Hampshire (GB)

(73) Assignee: Atmel Corporation, San Jose, CA (US)

( * ) Notice: Subject to any disclaimer, the term of this patent is extended or adjusted under 35 U.S.C. 154(b) by 774 days.

(21) Appl. No.: 12/567,473

(22) Filed: Sep. 25, 2009

(65) Prior Publication Data

US 2011/0073383 A1    Mar. 31, 2011

(51) Int. Cl.
*G06F 3/044*    (2006.01)

(52) U.S. Cl.
USPC ............................. 345/173; 345/175; 345/87

(58) Field of Classification Search
USPC ................................................. 345/173–179
See application file for complete search history.

(56) References Cited

U.S. PATENT DOCUMENTS

| | | | |
|---|---|---|---|
| 6,088,024 A * | 7/2000 | Yamagata | 345/173 |
| 6,466,036 B1 * | 10/2002 | Philipp | 324/678 |
| 7,663,607 B2 | 2/2010 | Hotelling | |
| 7,875,814 B2 | 1/2011 | Chen | |
| 7,920,129 B2 | 4/2011 | Hotelling | |
| 8,031,094 B2 | 10/2011 | Hotelling | |
| 8,031,174 B2 | 10/2011 | Hamblin | |
| 8,040,326 B2 | 10/2011 | Hotelling | |
| 8,049,696 B2 * | 11/2011 | Wang | 345/87 |
| 8,049,732 B2 | 11/2011 | Hotelling | |
| 8,179,381 B2 | 5/2012 | Frey | |
| 2009/0295754 A1 * | 12/2009 | Chen | 345/175 |
| 2009/0315854 A1 | 12/2009 | Matsuo | |
| 2010/0134391 A1 * | 6/2010 | Wang | 345/87 |
| 2012/0242588 A1 | 9/2012 | Myers | |
| 2012/0242592 A1 | 9/2012 | Rothkopf | |
| 2012/0243151 A1 | 9/2012 | Lynch | |
| 2012/0243719 A1 | 9/2012 | Franklin | |

FOREIGN PATENT DOCUMENTS

WO    WO 2012/129247    9/2012

OTHER PUBLICATIONS

"Capacitive Touch Using Only an ADC ("CVD")", Microchip Technologies, Inc., Datasheet, AN1298, (Mar. 26, 2009), 4 pgs.
U.S. Appl. No. 61/454,936, filed Mar. 21, 2011, Myers.
U.S. Appl. No. 61/454,950, filed Mar. 21, 2011, Lynch.
U.S. Appl. No. 61/454,894, filed Mar. 21, 2011, Rothkopf.

* cited by examiner

*Primary Examiner* — Van Chow
(74) *Attorney, Agent, or Firm* — Baker Botts LLP (57) ABSTRACT

A method for measuring capacitance in a sensor device using an internal reference circuit element(s), and without implementing additional circuitry and devices external to the sensor device, is described. In some embodiments a method uses an output pin of the sensor device and an internal reference capacitor of the sensor device to identify a touch applied to a touch point or electrode coupled to the touch sensor. The method applies reference voltages to charge the reference capacitor and measure a signal received from an electrode, wherein the touch sensor controls switching within the touch sensor to apply the reference voltages to the reference capacitor.

16 Claims, 9 Drawing Sheets

| STEP | S1 | S2 | CONTROL | NOTES |
|---|---|---|---|---|
| 1 | OPEN | OPEN | GND | Ground C1 |
| 2 | CLOSED | OPEN | GND | CHARGE C1 (POS) |
| 3 | OPEN | OPEN | X | FIRST MEASUREMENT |
| 4 | OPEN | CLOSED | Vdd | CHARGE C1 (NEG) |
| 5 | OPEN | OPEN | X | SECOND MEASUREMENT |

METHOD AND APPARATUS TO MEASURE SELF-CAPACITANCE USING A SINGLE PIN

BACKGROUND

Touch sensors, such as touch buttons and sliders, are used to enhance a variety of functions and turn everyday devices into exciting new products. Touch sensors may be implemented using a variety of technologies, where a touch to the surface changes electrical relationships within the touch sensors. Quality testing of a touch sensors device or capacitive keyboard involves anticipating the operating conditions of the touch sensors to confirm consistent and acceptable performance.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

The functions or algorithms described herein may be implemented in software or a combination of software and human implemented procedures in one embodiment. The software may consist of computer executable instructions stored on computer readable media such as memory or other type of storage devices. Further, such functions correspond to modules, which are software, hardware, firmware or any combination thereof. Multiple functions may be performed in one or more modules as desired, and the embodiments described are merely examples. The software may be executed on a Digital Signal Processor (DSP), Application Specific Integrated Circuit (ASIC), microprocessor, microcontroller, virtual controller system, or other type of processor operating on a computer system, such as a personal computer, server or other computer system.

Touchscreen displays and user interfaces may be implemented in various configurations, and may include one or more conductive layers. The following discussion relates to methods for testing a device having an internal capacitance, such as a mutual capacitance sensor device, having a driving layer and a sensing layer. These testing methods use the electrical characteristics and behavior of a capacitive sensor to provide a simplified test configuration and procedure. By taking advantage of the internal structure of a touch sensor device, these test methods may reduce reliance on external testing components used in previous test configurations.

While the testing methods and apparatuses disclosed herein are described with respect to a capacitive touch sensor, the test methods and apparatuses are applicable to other configurations, including single layer and multiple layer configurations of capacitive traces in a sensing device. The techniques may also be used to test capacitive keyboards or other devices using capacitive sensors.

In an example embodiment, a touch sensor system includes at least one input port to receive an input signal from at least one electrode, the at least one electrode having a coupling capacitance. The touch sensor system further includes an Analog to Digital Converter (ADC) to convert received continuous analog signals to discrete digital values, which may be used for processing and further computation. The ADC output value is proportional to the magnitude of the input voltage (or current). The ADC may be implemented in a variety of ways as an electronic device, such as a direct conversion or flash circuit, a successive approximation converter, a ramp-compare converter, an integrating converter, a Sigma-Delta converter, and so forth. The digital output may be processed to apply a coding scheme to identify the corresponding analog input value. A touch sensor system may include a processing unit to perform operations in response to computer-readable instructions. The operations may incorporate the ADC output data. A capacitor, such as a filtering capacitor, may be coupled to the ADC input. The capacitor may be used as a reference capacitor for detecting a touch on the touch sensor electrodes. A set of switches is provided as a mechanism to couple charge to the reference capacitor. A first switch couples a first reference voltage to a first input of multiple multiplexor (MUX) inputs, and a second switch couples a second reference voltage to the first input of the MUX, the MUX having an output coupled to an ADC input, wherein a MUX controller selects at least one of the MUX inputs to provide as an input to the ADC. A switch controller controls the first switch to apply the first reference voltage to the first input of the MUX, and controls the second switch to apply the second reference voltage to the first input of the MUX. Further, a sensor controller is coupled to receive a first digital value from the ADC output after application of the first reference voltage, to receive a second digital value after application of the second reference voltage, and to determine a change in the coupling capacitance of the at least one electrode as a function of the first and second digital values.

Figure 1:
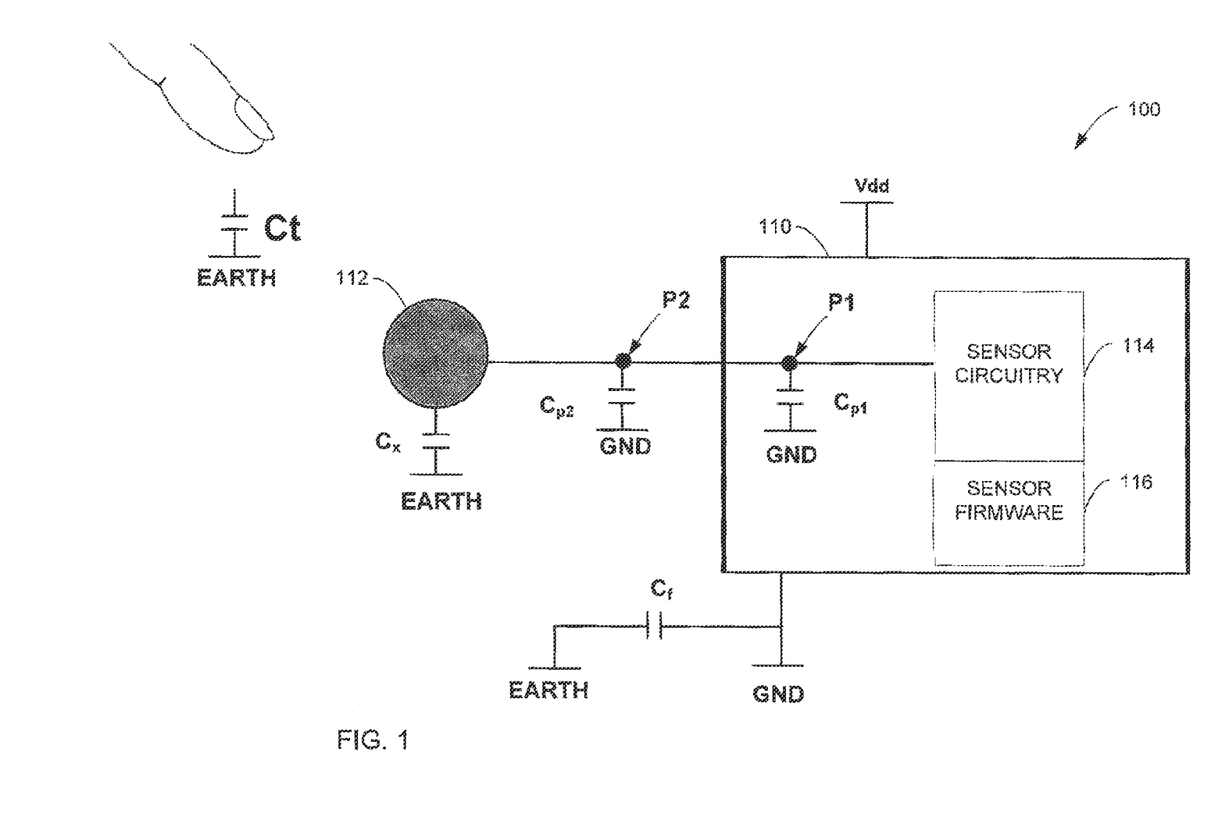
FIG. 1 is a block diagram illustrating electrical parameters of a capacitive device, according to an example embodiment.

FIG. 1 illustrates an equivalent circuit representing a capacitive sensor system 100 having a capacitive sensor device 110. The sensor system 100 has an electrode 112. The electrode 112 may be responsive to a touch by a human hand or a device, such as a stylus. The human hand or device has a touch capacitance $C_t$ measured with respect to earth or ground. The electrode 112 is coupled to sensor circuitry 114 within the sensor device 110. As the electrode 112 is provided behind or below a dielectric panel (not shown), the user does not have direct galvanic connection to the touch sensor circuitry 114.

Internal to sensor device 110, the sensor circuitry 114 may be coupled to sensor firmware 116 controlling the sensor device 110 and interpreting the received touches at the electrode 112. The structure and configuration of the sensor device 110 has various self capacitances, such as capacitance $C_{p1}$ which is measured at a point, P1, on a conductor between the electrode 112 and the sensor circuitry 114. The capacitance $C_{p1}$ is the parasitic Input/Output (I/O) pin capacitance considered with respect to a reference ground. The electrode 112 has an electrode capacitance $C_x$ with respect to a relative earth voltage, referred to as earth. A capacitance $C_{p2}$ is the wiring capacitance measured at a point P2, and is considered with respect to the reference ground. In the capacitive sensor system 100, reference ground is considered the voltage between a given point and a local circuit return point, wherein the reference ground voltage may be any voltage value to which the voltages of other points are compared. The reference ground voltage may be a specific voltage level applied to the sensor device 110, or may be a reference plane within the sensor device 110. In contrast, earth is considered a free space return point, such as the potential difference measured from a user's finger to the earth or environment. A touch capacitance $C_t$ exists between a human finger, or stylus, and earth. Between the relative ground and earth is a coupling capacitance $C_f$. These various capacitances exist in the configuration and structure of the capacitive sensor system 100.

In some examples, a test method includes the following assumptions:

$$C_x >> C_{p2} \quad (1)$$

$$C_x >> C_{p1} \quad (2)$$

$$C_f >> C_x \quad (3)$$

$$C_f >> C_t \quad (4)$$

in evaluation of the capacitive sensor system 100.

Figure 2:
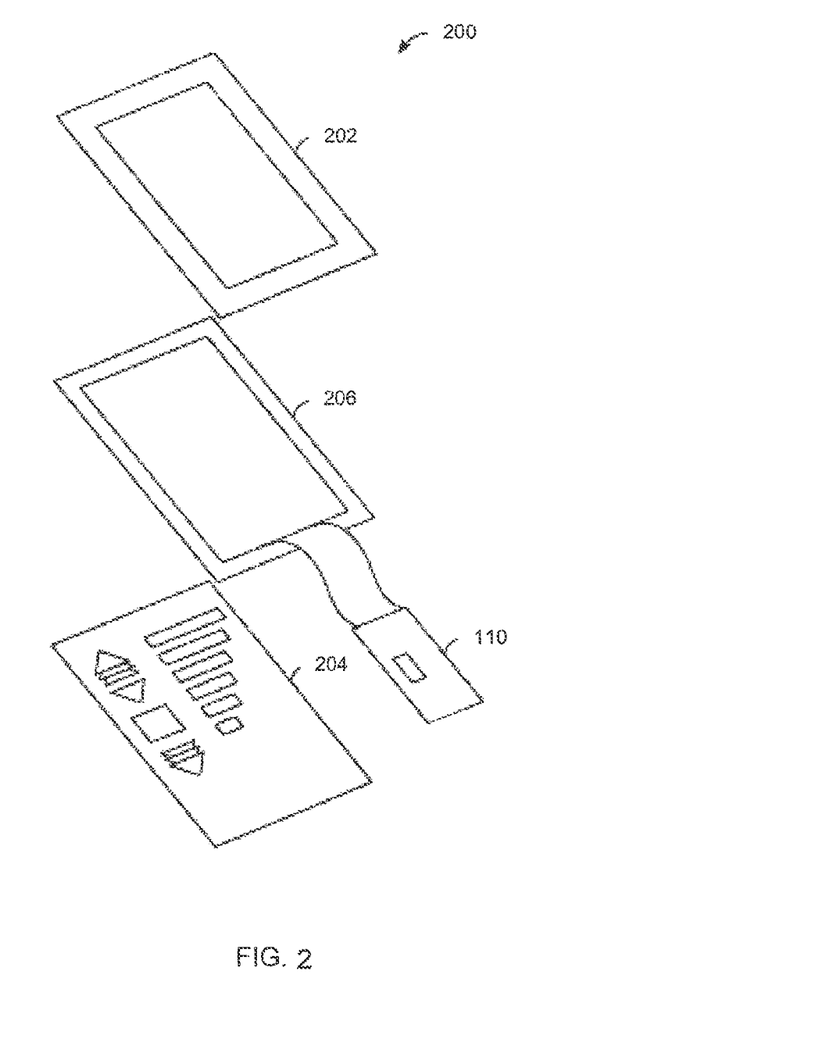
FIG. 2 is a block diagram illustrating a touch sensor system, according to an example embodiment.

FIG. 2 illustrates a touch sensor configuration 200 including the capacitive sensor device 110 coupled to a touch sensor interface 206. The touch sensor interface 206 may include one or more electrodes, similar to the electrode 112 of FIG. 1. A panel 202, such as a dielectric panel overlays the touch sensor interface 206. A display module 204 is positioned below the touch sensor interface 206, and is visible through the panel 202 and the touch sensor interface 206. The capacitive sensor device 110 receives inputs from the touch sensor interface, wherein the inputs may correspond to instructions, selections or other information provided by a user.

Some embodiments of touch sensor configurations include different combinations of layers, as well as different implementations of the sensing device. In the example illustrated in FIG. 2, the touch sensor interface 206 is implemented as a capacitive sensor as used in a variety of touch sensor devices.

Figure 3:
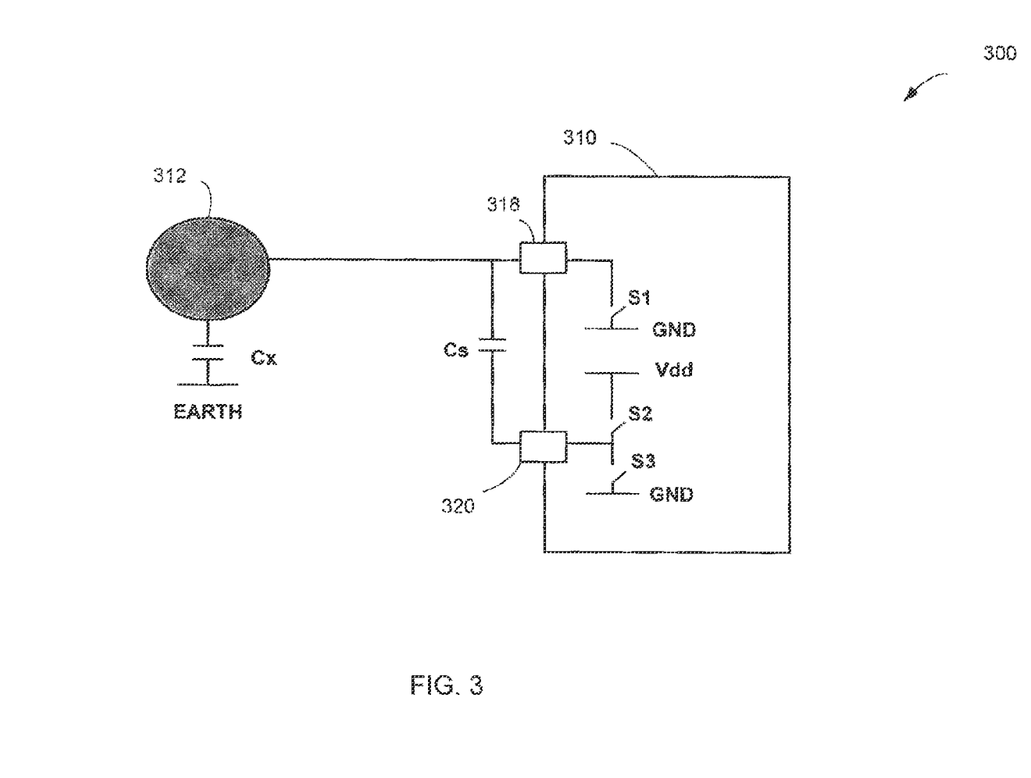
FIG. 3 is a block diagram illustrating a test configuration for the capacitive device as in FIG. 1, according to an example embodiment.

FIG. 3 illustrates a test configuration 300 for a sensor device 310 coupled to an electrode 312. As in the capacitive sensor system 100 of FIG. 1, the electrode 312 is position behind or below a dielectric panel, and thus does not make a galvanic connection with a user or stylus when a touch is made to the capacitive sensor system. The test configuration includes a sampling capacitor $C_s$ that is positioned between two output ports, 318 and 320, of the sensor device 310. Internally, the sensor device 310 has multiple switches, such as switch S1 which is used to connect port 318 to an electrical ground, switch S2 which is used to connect port 320 to a reference voltage $V_{DD}$, and a switch S3 which is used to connect port 320 to a reference ground.

Figure 4:
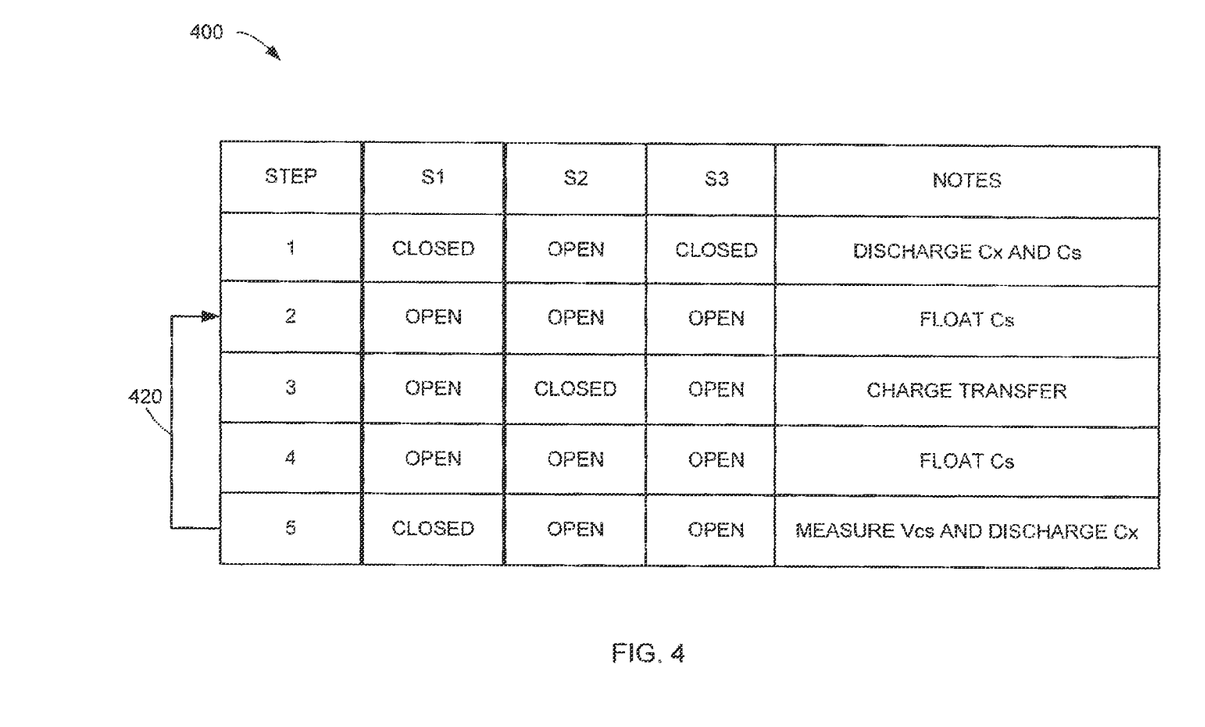
FIG. 4 is a table illustrating the operations in testing the capacitive device using the test configuration of FIG. 3, according to an example embodiment.

With reference to the test configuration 300 of FIG. 3, a table 400 is provided in FIG. 4 illustrating operations for testing the sensor device 310. The left-most column provides the step index, wherein steps are performed sequentially as indicated. The next column identifies the behavior or condition of switch S1, successive columns identify the behavior of condition of switches S2 and S3, respectively. Notes are provided to explain the test procedure. The test procedure measures the capacitance $C_x$ using the sampling capacitance $C_s$. This may be done by monitoring the behavior of the capacitance $C_x$, in response to sequence of bursts or charge transfers. The bursts are provided using the switches. In this way, a burst switching sequence is applied to determine the capacitance $C_x$. A burst is a sequence of charge transfers. By controlling switches S1, S2 and S3, the process transfers charge to capacitor $C_x$ through $C_s$ by repeating the bursts to measure or calculate $C_x$.

At step 1 of table 400 the switch S2 is open, while the switches S1 and S3 are closed. Connecting both sides of the sampling capacitor to relative ground effectively discharges any residual charge stored on the sampling capacitor, $C_s$, as well as on the electrode's capacitance, $C_x$. This is an initial condition of a measurement process, referred to as an acquisition phase.

At step 2 of table 400 the switches S1, S2 and S3 are open allowing the capacitors to float, and specifically allowing the sampling capacitor $C_s$ to float. This prevents cross-conduction within transistors of the sensor device 310.

At step 3, switch S2 is closed, while the switches S1 and S3 remain open. Charge is driven through sampling capacitor $C_s$ to the capacitor $C_x$. In this switching state, the same current flows through $C_s$ and $C_x$ so the charge transferred to each capacitor is effectively the same. Then at step 4, the switches S1, S2 and S3 are open allowing the sampling capacitor $C_s$ to float. As in step 2, allowing the capacitors to float prevents cross-conduction between transistors in the sensor device 310. There is a settling time to allow the charge distribution to settle.

At step 5, the switch S1 is closed, while switches S2 and S3 remain open, which discharges the capacitor $C_x$. This completes a burst, and processing returns, 420, to step 2 for a next burst. Burst switching allows transfer of charge to the capacitance $C_x$ through the capacitance Cs. The time to charge $C_x$, or the number of burst cycles used, is related to a ratio of capacitance for $C_x$ to $C_s$. As Cx and Cs form a potential divider circuit defined by:

$$V(C_s) = (C_x * V_{dd})/(C_s + C_x) \quad (5)$$

wherein $V(C_s)$ is the voltage across the sampling capacitor $C_s$. During each burst cycle, $V(C_s)$ increases in small steps. When $V(C_s)$ reaches a predetermined voltage value, the acquisition phase ends. The time taken to complete the acquisition phase may be used to evaluate $C_x$.

In some embodiments, the number of burst cycles is the measurement used to evaluate the touch sensor 310. In other words, each acquisition corresponds to the condition of the electrode 312. When the electrode 312 is in an ambient state, the number of burst cycles for each acquisition corresponds approximately to a predetermined value. As a human finger or a stylus is brought proximate the electrode 312, the number of burst cycles during the acquisition phase changes and is different from the predetermined value, which indicates a touch to the electrode 312.

In some embodiments, repeated acquisitions are used to effectively measure the capacitance $C_x$. When a touch is applied to the electrode 312, which acts as a touch sense electrode, the capacitance $C_t$ increases and adds in parallel with capacitance $C_x$ (see FIG. 1). The increase in $C_t$ changes the effective circuit such that $C_t$ and $C_x$ charge in parallel, resulting in a more rapid increase in the voltage $V(C_s)$. Therefore, when a touch is applied to the electrode 312 fewer burst cycles are required to charge the capacitor $C_s$ in order to achieve $V(C_s)$, and therefore in response to a touch event, the number of burst cycles is reduced and the burst time shortened. The change in the number of burst cycles during an acquisition is proportional to $C_t$.

In some embodiments a calibration stage is used to determine the predetermined values for measurements. Once the reference value for the number of burst cycles is determined, this may be used as a threshold value to identify a potential touch. During an acquisition, if the number of burst cycles drops below the threshold value, a potential touch is identified. A process of Detection Integration (DI) may consider several successive acquisitions before identifying a touch event. The DI process detects a touch to a key or touch event for the touch sensor configuration 200 of FIG. 2. The DI process assists in avoiding noise and other inadvertent effects which may be interpreted as a touch, but which are false reads.

Figure 5:
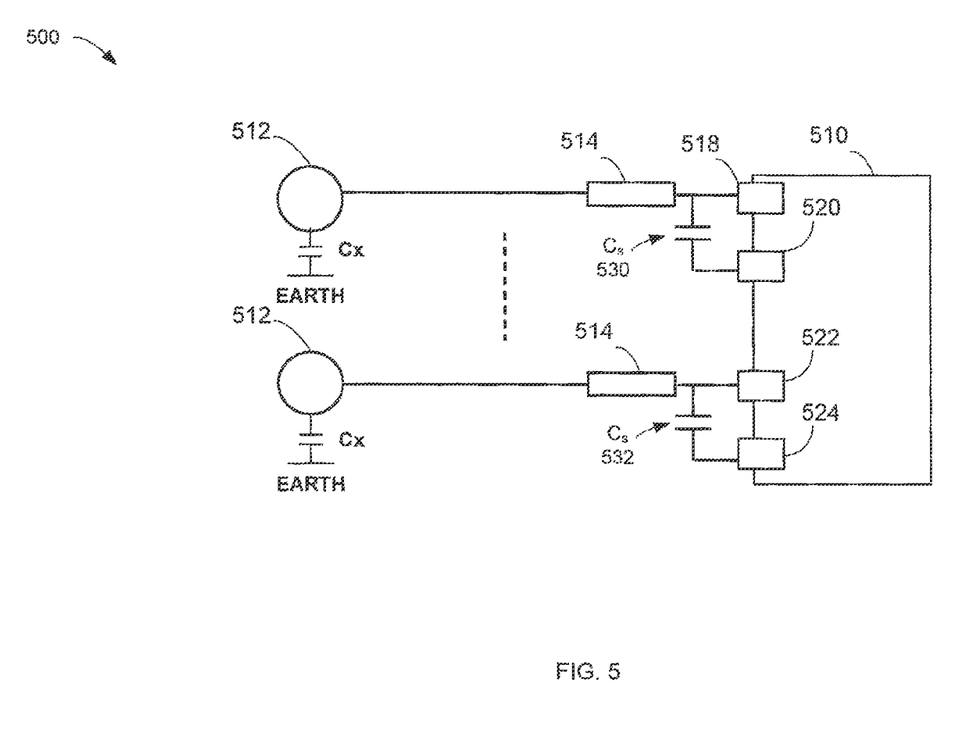
FIG. 5 is a block diagram illustrating a test structure for a touch sensor device, according to an example embodiment.

FIG. 5 illustrates application of the test configuration 300 to a sensor device 510 having multiple ports, each coupled to an electrode 512. The test configuration 500 is illustrated, wherein the ports of the sensor device 510 are coupled to sampling capacitors 530, 532. As illustrated in FIG. 5, the device sensor 510 includes multiple ports, including at least ports 518, 520, 522 and 524. The ports 518 and 522 each are coupled to electrodes 512, each having a line resistance 514. A sampling capacitor $C_s$ 530 is positioned between the port 518 and the port 520. A sampling capacitor $C_s$ 532 is positioned between port 522 and port 524. As may be appreciated, the test configuration 500 adds a sampling capacitor $C_s$ to each electrode 512.

The test configurations 300 and 500 require the addition of sampling capacitors for each electrode. As the number of electrodes increases, the number of sampling capacitors also increases. In an example embodiment, a testing method uses relationships within a sensor device, or sensor circuitry, to measure the capacitance $C_x$.

Figure 6:
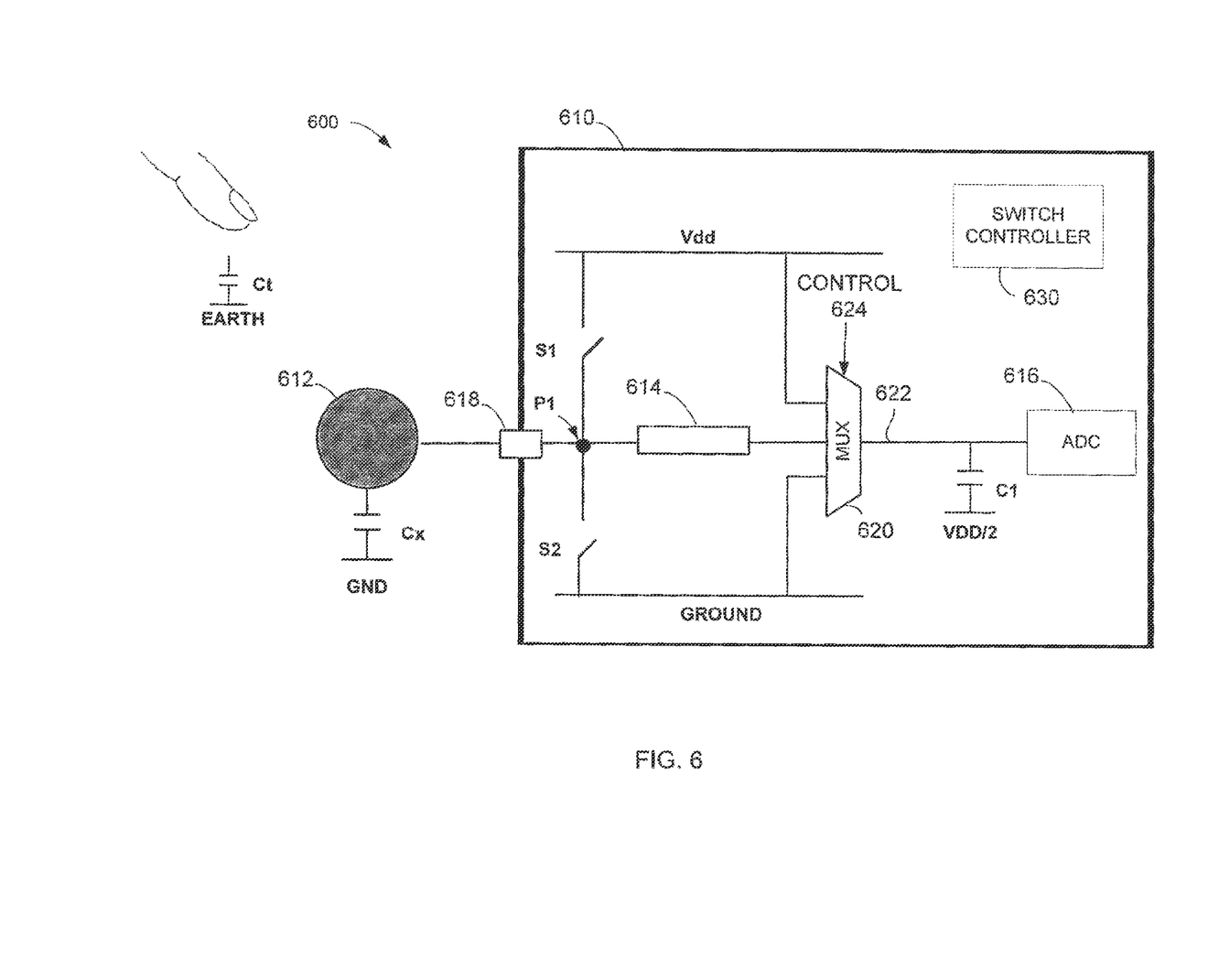
FIG. 6 is a block diagram illustrating a test configuration to measure self-capacitance using a single pin of a touch sensor device, according to an example embodiment.

FIG. 6 illustrates a sensor device 610 having circuitry including an Analog to Digital Converter (ADC) 616, multiple switches, S1 and S2, and a switch controller 630. The configuration 600 eliminates the use of a sampling capacitor external to the sensor device 610, such as used in the system of FIG. 3. The touch sensor configuration 600 instead uses a capacitor, $C_1$, coupled to the ADC 616, which is included in the sensor device 610, thus reducing the circuitry required to implement the touch sensor configuration 600. During operation of the sensor device 610, the switch controller 630 selectively opens and closes the switches S1 and S2. In some embodiments, the switches S1 and S2 may be controlled individually, wherein the switch 51 couples point P1 to a reference voltage Vdd, and the switch S2 couples the point P1 to a reference ground. The reference voltage Vdd is provided to the sensor device 610, such as through a designated pin (not shown) or by processing a received voltage or electrical signal. The reference ground may be provided to the sensor device 610 through a designated pin, or may be the voltage of a location within the sensor device 610. For clarity of description, a single electrode 612, having corresponding capacitance $C_x$ is illustrated coupled to port 618, however, it is to be appreciated that sensor device 610 may include any number of electrodes 612 and ports 618. Port 618 is then coupled to a multiplexer (MUX) 620, wherein the connection has a line resistance 614. The MUX 620 has multiple inputs to receive inputs presented to ports, such as electrical signals, current or voltage received at port 618 from the electrode 612. The MUX 620 also has inputs coupled directly to the reference voltage Vdd, and to the reference ground which has an associated ground voltage. A control input 624 is used to select one among the multiple inputs to the MUX 620, wherein the selected one is supplied to the ADC 616. The connection 622 couples the output of MUX 620 to the input of the ADC 616. The sensor device 610 is further configured such that the switch S1 enables connection of the port 618 to the reference voltage Vdd, and the switch S2 enables connection of the port 618 to the reference ground.

As illustrated in FIG. 6 the switches S1 and S2 are coupled to the input of the MUX 620. In a device having multiple input ports, each input port has a corresponding set of switches, such as S1 and S2. An example is provided in FIG. 8, wherein a bank of switches 811 is implemented having a switch controller 813.

The sensor device 610 further has a capacitor, $C_1$, coupled to the input to the ADC 616. The capacitor $C_1$ provides a filtering effect, to reduce or avoid fluctuations in voltage or signals provided from the output of MUX 620 to the input of the ADC 616. The capacitor C1 may be used as a reference capacitor to identify electrical changes at the electrode 612. The voltage Vdd/2 may be provided to device sensor 610, such as through a pin, or may be produced from the reference voltage Vdd.

An example embodiment uses the capacitance $C_1$, to identify changes in the capacitance $C_x$, avoiding the need to add a sampling capacitor external to sensor device 610. This reduces the need for external circuitry and provides a simplified configuration for touch sensing in touch sensor configuration 600. The switches S1 and S2 allow burst switching to measure changes corresponding to a touch to the electrode 612. Such a method is described in the table 700 of FIG. 7. The left-most column provides the step index, wherein steps are performed sequentially as indicated. The next column identifies the behavior or condition of switch S1, successive columns identify the behavior of switch S2 and the control input, respectively. Notes are provided to explain the test procedure.

Figure 7:
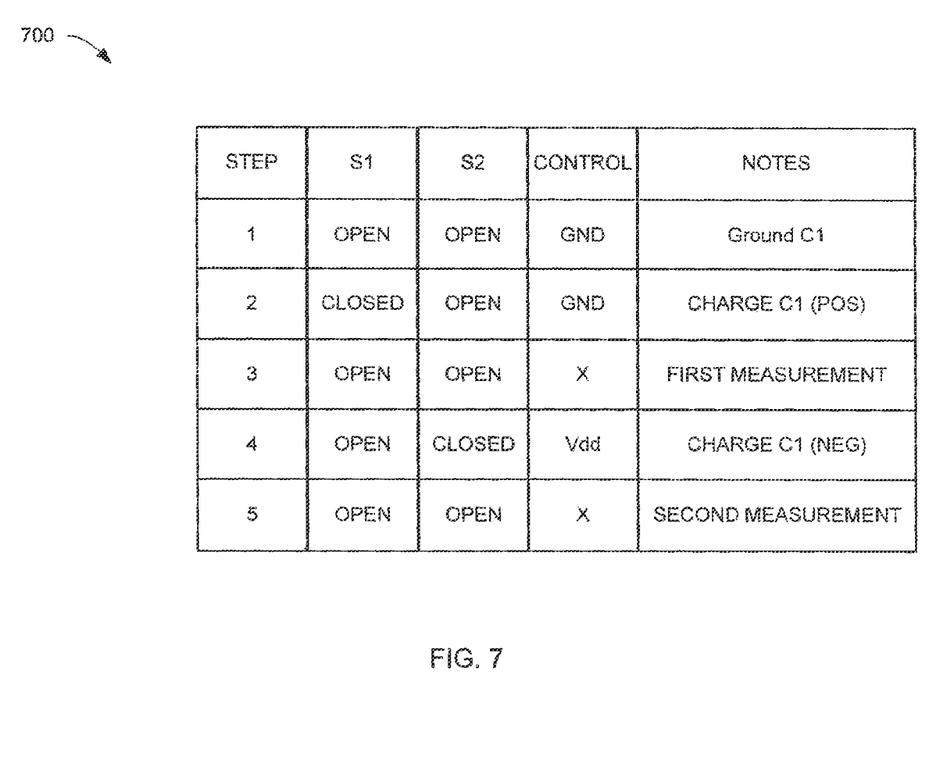
FIG. 7 is a table illustrating operations in testing the self-capacitance of the touch sensor device of FIG. 5, according to an example embodiment.

At a first step 1, the switches S1 and S2 are open, while control 624 couples the reference ground as input to the MUX 620. This grounds the capacitance $C_1$ to discharge any residual voltage.

At step 2, switch S1 is closed, while switch S2 is open. The control 624 couples Vdd as an input to the MUX 620. In this configuration, the capacitor $C_1$ is charged to a positive value. The voltage across the capacitor $C_1$ is the difference of Vdd and Vdd/2, or Vdd/2. In some embodiments, an input signal having a positive amplitude is provided to the input to the MUX 620 at this step.

At step 3, switches S1 and S2 are open, and the input to the MUX 620 is the input received at port 618 from the electrode 612. A first measurement is made of the voltage $V(C_1)$, which represents a positive voltage. The measurement is made by the ADC 616.

At step 4, switch S1 remains open while switch S2 is closed. The control 624 couples reference ground as an input to MUX 620. This serves to charge the capacitor $C_1$ to a negative value. The voltage across the capacitor $C_1$ is the difference of the ground voltage and Vdd/2, which is a negative voltage in comparison to Vdd/2. In some embodiments, an input signal is applied to the input to the MUX 620 which has an opposite polarity to the input signal applied at step 2, such as to use two opposing pulses. The opposing pulses act to reject low frequency noise such as mains interference from a power supply. In other words, if mains interference is present in the reference voltage Vdd, such interference will not be present in the ground reference voltage GND. Therefore, the interference will be present in one measurement, but not in the other measurement. By comparing the measurements, the mains interference may be removed. At step 5, switches S1 and S2 are open, and the input to the MUX 620 is the input received at port 618 from the electrode 612. A second measurement is made of the voltage $V(C_1)$, which in this situation represents a negative voltage. The measurement is made by the ADC 616.

By measuring the capacitance using a positive pulse and a negative pulse, low frequency interference may be rejected mathematically. Interference may include the frequency of the processing unit (not shown), referred to as the mains hum. The low frequency interference exhibits as a same value in the measurements, while the measured value of the ADC 616 reflects a positive and an inverted signal. This allows cancellation of the interference. The measurements described in table 700 of FIG. 7 are based on the sharing of charge between the capacitance $C_x$ and the capacitance $C_1$.

Figure 8:
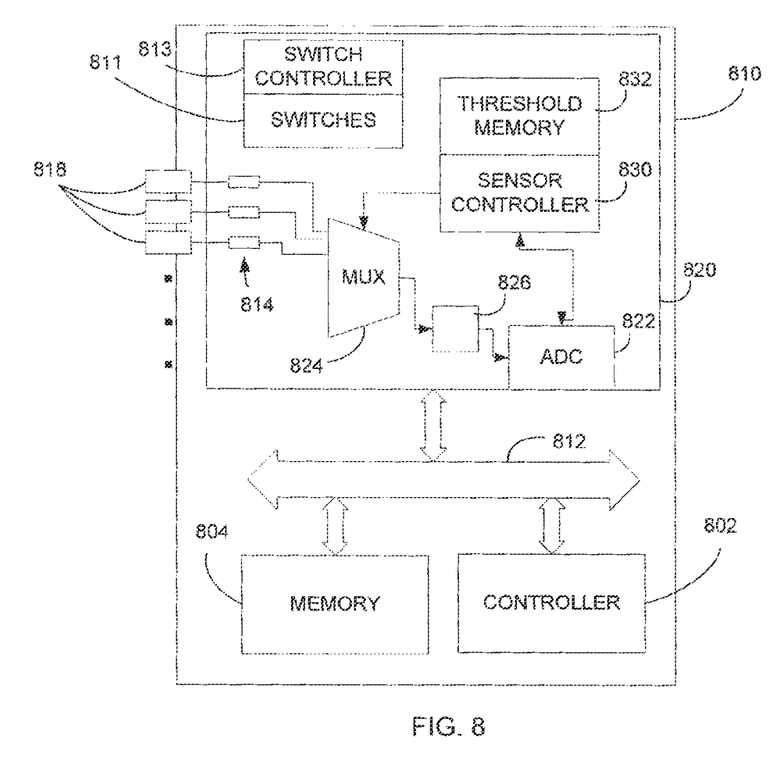
FIG. 8 is a block diagram of the touch sensor device of FIG. 5, according to an example embodiment.

FIG. 8 illustrates a processing unit 810, including a sensing circuitry 820 to process signals received from electrodes (not shown) coupled to ports 818. The processing unit 810 includes a controller 802 and a memory 804 coupled to the sensing circuitry 820 through communication bus 812. A threshold memory 832 is included within the sensing circuitry 820 to store threshold values and information to identify capacitance changes. It is appreciated that various embodiments may have additional modules, circuitry, software, firmware and functionality, coupled directly or through buses or circuitry. For example, the processing unit 810 may be part of an application, such as illustrated in touch sensor configuration 200 of FIG. 2. The sensing circuitry 820 includes an ADC 822 which outputs a digital value corresponding to a received analog value. The ports 818 are each coupled to inputs of a MUX 824, and each has a line resistance 814. The sensor controller 830 may provide a control signal to the MUX 824 to select one of the inputs of the MUX 824 to output to ADC 822. Configured between the MUX 824 and the ADC 822 is a reference circuit 826, which in some embodiments includes a reference capacitor. The reference circuit 826 is used to identify a change in electrical behavior or characteristics at the electrodes. When a touch is received at an electrode, the capacitance of the electrode changes due to the proximity of the touching mechanism, such as a human finger, a stylus or other device, to the electrode.

The sensor controller 830 may further control operation of the ADC 822. In some embodiments a reference capacitor may be a variable capacitor used to adjust the sensitivity of the touch sensor.

A bank of switches 811 is coupled to the input ports 818, wherein each of the input ports has an associated switch pair, e.g. S1 and S2, within the bank of switches 811. Other arrangements and configurations may be implemented so as to provide a switching configuration as in FIG. 6 for each port 818. In other words, each pin 818 has a switch S1 coupled to reference voltage Vdd and a switch S2 coupled to a relative ground, GND. Operations for testing each of the ports 818 is performed similarly to the testing of port 618. The bank of switches 811 is controlled by a switch controller 813, which controls each of the switch pairs, S1 and S2, within the bank of switches 811.

Figure 9:
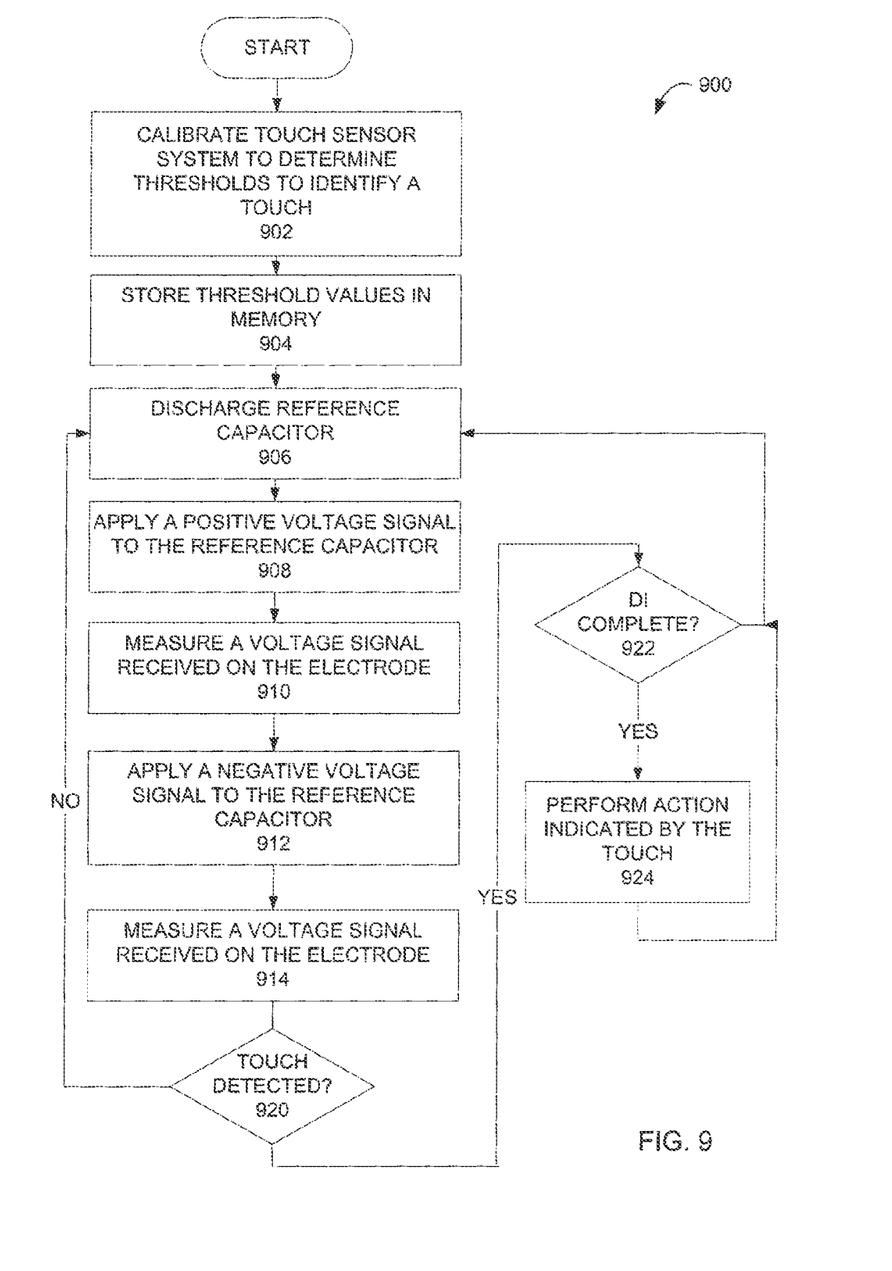
FIG. 9 is a flow diagram of a method for testing self-capacitance of the touch sensor, according to an example embodiment.

FIG. 9 illustrates a method 900 starting with an operation 902 to calibrate the touch sensor system, such as the touch sensor configuration 600 of FIG. 6. The calibration phase determines threshold values for a reference capacitor, such that the touch sensor system is able to distinguish between an ambient condition, where no touch is applied to the touch sensor system, and a condition when a touch is applied. Operation 904 serves to store the threshold values in a memory storage device. Processing of an acquisition phase first discharges 906 the reference capacitor, such as capacitor $C_1$ of FIG. 6. A positive voltage is applied to the reference capacitor (operation 908) and a signal received from the electrode is measured (operation 910). The process 900 continues, and a negative voltage signal is applied to the reference capacitor (operation 912), and a signal received from the electrode is measured (operation 914).

A comparison and evaluation of the measurements is made to eliminate interference from the signals and identify a touch event. When a touch is not detected at decisional operation 920, processing returns to operation 906 to begin a next acquisition. In other words, the electrode is in an ambient state and no touch is detected. When a touch is detected at decision operation 920 processing continues to determine if the DI is completed (decisional operation 922). When the DI is complete and the received signals from the electrode satisfy the touch threshold value, the touch detection is confirmed and processing continues to perform the action indicated by the touch (operation 924). For example, when a user applies a touch to the electrode in order to select a key or button on the touch sensor device, the function associated with that key is implemented when the touch is detected. After detection of the touch, processing returns to operation 906 and a next acquisition begins. When the DI is not completed at decisional operation 922, processing returns to operation 906 to continue the current acquisition. In other words, an acquisition identifying a touch continues until the DI is complete, or a measurement is received that does not satisfy the threshold value. The DI is implemented to avoid spurious measurements, or measurements which are not results of a touch at the electrode but rather are due to other operational conditions.

The present discussion considers a method for measuring capacitance in a sensor device without additional circuitry and devices applied external to the sensor device, such as by using an output pin of the sensor device. The measurement methods described use an internal capacitor, or other electrical component, as a reference to identify a touch applied to a touch point or electrode coupled to the touch sensor. The touch sensor applies charges to the reference capacitor and measures a signal received from an electrode. The measurements are used to identify a touch to the electrode.

The methods and apparatus described may be used in conjunction with an appliance having a human-machine interface. It is also possible to provide a sensor, similar to those described above, which is provided separately from the device or appliance which it controls, for example to provide an upgrade to a pre-existing appliance. It is also possible to provide a generic sensor which may be configured to operate on a range of different appliances.

Although the test methods and apparatuses have been described with respect to several embodiments, many modifications and alterations can be made without departing from the invention. The drawings provided are not intended to identify a particular size or scale of a module, but rather are provided for clarity of understanding as to testing and evaluation of a sensor device. Similarly, the concepts described herein may be applied to product enhancement involving introduction of a dual layer device, where measurement of values in a single layer device required complex circuitry or prove difficult in an assembled package.

The invention claimed is:

1. A touch sensor system, comprising:
at least one input port to receive an input signal from at least one electrode, the at least one electrode having a capacitance;
an Analog to Digital Converter (ADC) having an ADC input and an ADC output;
a capacitor coupled to the ADC input;
a multiplexer (MUX) having multiple MUX inputs and a MUX output that is coupled to the ADC input, wherein the at least one input port is coupled to one of the multiple MUX inputs;
a first switch for coupling a first reference voltage to a first input of the multiple MUX inputs;
a second switch for coupling a second reference voltage to the first input of the multiple MUX inputs;
a switch controller operable to:
control the first switch to apply the first reference voltage to the first input of the MUX; and
control the second switch to apply the second reference voltage to the first input of the MUX; and
a sensor controller operable to:
receive a first digital value from the ADC output after application of the first reference voltage;
receive a second digital value from the ADC output after application of the second reference voltage;
determine, based at least upon the first and second digital values, an amount of mains interference;
remove the determined amount of mains interference from the first digital value; and
determine a change in the capacitance of the at least one electrode as a function of the first digital value.

2. The touch sensor system of claim 1, further comprising:
a MUX controller operable to select the at least one electrode as an input to the ADC input; and
wherein the sensor controller is further operable to determine a change in the capacitance of the at least one electrode as a function of the first digital value and the second digital value.

3. The touch sensor system of claim 1, wherein the first reference voltage is opposite in polarity to the second reference voltage.

4. The touch sensor system of claim 1, wherein the sensor controller is further configured to evaluate the first and second digital values against a threshold value to detect a touch at the at least one electrode.

5. A method, comprising:
controlling a first switch to charge a reference capacitor to a first voltage level, the reference capacitor coupled to an input of an Analog to Digital Converter (ADC);
receiving a first analog signal from a touch sensor electrode at the input of the ADC;
converting the first analog signal to a first digital value provided at an output of the ADC;
controlling a second switch to charge the reference capacitor to a second voltage level by applying a second voltage;
receiving a second analog signal from the touch sensor electrode at the input to the ADC;
converting the second analog signal to a second digital value at the output of the ADC;
determining, based at least upon the first and second digital values, an amount of mains interference;
removing the determined amount of mains interference from the first digital value;
detecting a touch to the touch sensor device based on the first digital value.

6. The method of claim 5, further comprising
controlling a multiplexer (MUX) to select an input to the ADC.

7. The method of claim 5, wherein the reference capacitor is further coupled to a reference voltage, and the first voltage level is opposite in polarity to the second voltage level with respect to the reference voltage.

8. The method of claim 7, wherein the reference voltage is a function of the first voltage level.

9. The method of claim 5, wherein the second voltage level is a ground voltage.

10. The method of claim 5, wherein detecting a touch further comprises:
calculating a difference between the first digital value and second digital value; and
comparing the difference to a threshold value.

11. The method of claim 5, wherein controlling the first switch to charge the reference capacitor to the first voltage level comprises closing the first switch and opening the second switch.

12. The method of claim 5, wherein controlling the second switch to charge the reference capacitor to the second voltage level comprises closing the second switch and opening the first switch.

13. The method of claim 5, wherein converting the first analog signal to a first digital value at the output of the ADC comprises opening the first and second switches, and wherein converting the second analog signal to a second digital value at the output of the ADC comprises opening the first and second switches.

14. A non-transitory computer-readable medium comprising instructions which, when implemented by one or more machines, cause the one or more machines to:
control a first switch to charge a reference capacitor to a first voltage level, the reference capacitor coupled to an input of an Analog to Digital Converter (ADC);
receive a first analog signal from a touch sensor electrode at the input of the ADC;
convert the first analog signal to a first digital value provided at an output of the ADC;
control a second switch to charge the reference capacitor to a second voltage level;
receive a second analog signal from the touch sensor electrode at the input to the ADC;
convert the second analog signal to a second digital value at the output of the ADC;
determine, based at least upon the first and second digital values, an amount of mains interference;
remove the determined amount of mains interference from the first digital value;
detect a touch to the touch sensor device based on the first and second digital values.

15. The non-transitory computer-readable medium of claim 14, wherein to detect a touch is further configured to:
calculate a difference between the digital value and second digital value; and
compare the difference to a threshold value.

16. The non-transitory computer-readable medium of claim 14, wherein:
to convert the first analog voltage to the first digital value at the output of the ADC is further to open the first and second switches; and
to convert the second analog voltage to the second digital value at the output of the ADC is further to open the first and second switches.

* * * * *